US010999939B2

(12) United States Patent
Chien et al.

(10) Patent No.: US 10,999,939 B2
(45) Date of Patent: *May 4, 2021

(54) CIRCUIT CARRIER BOARD AND MANUFACTURING METHOD THEREOF

(71) Applicant: Unimicron Technology Corp., Taoyuan (TW)

(72) Inventors: Chun-Hsien Chien, New Taipei (TW); Wen-Liang Yeh, Hsinchu (TW); Wei-Ti Lin, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/535,102

(22) Filed: Aug. 8, 2019

(65) Prior Publication Data

US 2019/0380212 A1 Dec. 12, 2019

Related U.S. Application Data

(63) Continuation-in-part of application No. 16/244,113, filed on Jan. 10, 2019, now Pat. No. 10,888,001.
(Continued)

(30) Foreign Application Priority Data

Oct. 18, 2018 (TW) .................................. 107136704
Jun. 6, 2019 (TW) .................................. 108119700

(51) Int. Cl.
*H05K 7/10* (2006.01)
*H05K 7/12* (2006.01)
(Continued)

(52) U.S. Cl.
CPC .......... *H05K 3/4682* (2013.01); *H05K 1/115* (2013.01); *H05K 3/0047* (2013.01); *H05K 3/4038* (2013.01); *H05K 2201/09509* (2013.01)

(58) Field of Classification Search
USPC ....................................................... 361/767
See application file for complete search history.

(56) References Cited

U.S. PATENT DOCUMENTS 9,922,845 B1 3/2018 Shih
2006/0272853 A1* 12/2006 Muramatsu ......... H01L 21/4857
174/262

FOREIGN PATENT DOCUMENTS

TW I369933 8/2012
TW I599008 9/2017
(Continued)

OTHER PUBLICATIONS

"Office Action of Taiwan Counterpart Application", dated May 14, 2020, p. 1-p. 11.
(Continued)

*Primary Examiner* — Andargie M Aychillhum
(74) *Attorney, Agent, or Firm* — JCIPRNET (57) ABSTRACT

A circuit carrier board includes a first build-up layer structure, a substrate, an adhesive layer, and a conductive structure. The first build-up layer includes a plurality of first dielectric layers and a plurality of first circuit layers original stacked. The substrate includes a base and a second build-up layer structure disposed on the base. The second build-up layer structure includes a plurality of second dielectric layers and a plurality of second circuit layer original stacked. A top most layer of the second circuit layers is exposed outside of the second dielectric layers. The conductive structure penetrates through the first dielectric layers, the first circuit layers and the adhesive layer, and contacts with the top most
(Continued)

layer of the second circuit layers. The conductive structure electrical connects the first circuit layers to the second circuit layers. A manufacturing method of the circuit carrier board is also provided.

5 Claims, 8 Drawing Sheets

Related U.S. Application Data (60) Provisional application No. 62/682,181, filed on Jun. 8, 2018.

(51) Int. Cl.
*H05K 3/46* (2006.01)
*H05K 1/11* (2006.01)
*H05K 3/40* (2006.01)
*H05K 3/00* (2006.01)

(56) References Cited

FOREIGN PATENT DOCUMENTS

| TW | 201844065 | 12/2018 |
|----|-----------|---------|
| TW | 201918140 | 5/2019  |

OTHER PUBLICATIONS

"Office Action of Taiwan Related Application, application No. 107136704", dated Dec. 13, 2019, pp. 1-5.
"Office Action of Taiwan Related Application, application No. 108115660", dated Mar. 9, 2020, pp. 1-5.

* cited by examiner

CIRCUIT CARRIER BOARD AND MANUFACTURING METHOD THEREOF

CROSS-REFERENCE TO RELATED APPLICATION

This application is a continuation-in-part application of and claims the priority benefit of U.S. application Ser. No. 16/244,113, filed on Jan. 10, 2019, which claims the priority benefits of U.S. provisional application Ser. No. 62/682,181, filed on Jun. 8, 2018, and Taiwan application serial no. 107136704, filed on Oct. 18, 2018. This application also claims the priority benefit of Taiwan application serial no. 108119700, filed on Jun. 6, 2019. The entirety of each of the above-mentioned patent applications is hereby incorporated by reference herein and made a part of this specification.

BACKGROUND

Technical Field

The present invention relates to a circuit carrier board and a manufacturing method thereof, and more particularly to a circuit carrier board having a conductive structure that electrically connects to different build-up structures.

Description of Related Art

In general, the multilayer circuit structure of a circuit board is mostly manufactured by a build-up method or a laminated method, and thus has the features of high circuit density and reduced circuit spacing. For example, the multilayer circuit structure is formed by combining a copper foil and a PrePreg into a build-up layer structure and stacking the build-up layer structure on a core layer via repeated lamination to increase the internal wiring space of the multilayer circuit structure, wherein the conductive material on the build-up layer structure may form conductive circuits according to the required circuit layout, and the blind vias or through-holes of the build-up layer structure may be additionally filled with a conductive material to conduct each of the layers. Thus, the multilayer circuit structure may be manufactured by adjusting the number of circuit structures according to requirements and via the above method.

With the advancement of technology, all kinds of electronic products are developed to have high speed, high efficiency, and be compact. Under this trend, how to simplify the manufacturing process of circuit boards with high-density circuit layers and improve production yields are urgent problems to be solved in the field.

SUMMARY

The invention provides a circuit carrier board and a manufacturing method thereof, which may reduce the manufacturing difficulty of the circuit carrier board, reduce the production cost, and improve the production yields, in addition to having good quality.

The manufacturing method of the circuit carrier board of the invention comprises the following steps. A temporary carrier board is provided. A first build-up layer structure is formed on the temporary carrier board. The first build-up layer structure includes a plurality of first dielectric layers and a plurality of first circuit layers disposed in the first dielectric layers. A substrate is formed, wherein the substrate includes a second build-up layer structure. The second build-up layer structure includes a plurality of second dielectric layers and a plurality of second circuit layers disposed in the second dielectric layers. A topmost layer of these second circuit layers is exposed outside of the second dielectric layers. An adhesive layer is disposed on one of the first build-up lauer structure or the second build-up layer structure. The first build-up layer structure is bonded to the second build-up layer structure, wherein the adhesive layer is between the first build-up layer structure and the second build-up layer structure. The temporary carrier board is removed. A drilling process is performed to the first build-up layer structure, while penetrating the plurality of the first dielectric layers, the plurality of the first circuit layers, and the adhesive layer to form a blind via to expose a portion of the topmost layer of the second circuit layers. And, a conductive structure is formed in the blind via, wherein the conductive structure is electrically connects the first circuit layers to the topmost layer of the second circuit layers.

In an embodiment of the invention, the step of forming the first build-up layer structure includes alternatively stacking the first circuit layer and the first dielectric layer on the temporary carrier board, wherein the first circuit layers are electrically connected to each other.

In an embodiment of the invention, the step of forming the substrate includes providing a base and forming a second build-up layer structure on the base, wherein the second circuit layers and the second dielectric layers in the second build-up layer structure are alternately stacked on the base, and the second circuit layers are electrically connected to each other.

In an embodiment of the invention, the step of forming the conductive structure includes forming a photoresist pattern on the first build-up layer structure. The photoresist pattern is used as a mask, and the conductive material is disposed in the blind via to form a conductive structure having continuous sidewalls, wherein the conductive structure serially connects the first circuit layers in a direction perpendicular to the substrate. And, the photoresist pattern is removed.

In an embodiment of the invention, the step of forming the conductive structure includes: forming a conductive material on the first build-up layer structure, and filling the conductive material into the blind via. And a planarization process is performed to remove a portion of the conductive material, so as to form the conductive structure having a continuous sidewall from the conductive material filled in the blind via. The conductive structure serially connects the first circuit layers in the direction perpendicular to the substrate.

In an embodiment of the invention, the manufacturing method of the circuit carrier board further includes forming a solder resist layer partially covering the first build-up layer structure and the conductive structure. The solder resist layer has a plurality of openings respectively partially exposing the first circuit layer and the conductive structure.

The circuit carrier board of the invention includes a first build-up layer structure, a substrate, an adhesive layer, and a conductive structure. The first build-up layer structure includes a plurality of first dielectric layers and a plurality of first circuit layers alternately stacked, and the first circuit layers are disposed in the first dielectric layers. The first circuit layers are electrically connected to each other. The substrate includes a base and the second build-up layer structure is disposed on the base. The second build-up layer structure includes a plurality of second dielectric layers and a plurality of second circuit layers alternately stacked, and the second circuit layers are disposed in the second dielectric layers. The second circuit layers are electrically connected to each other. A topmost layer of the second circuit layers is exposed outside of the second dielectric layer. The adhesive layer is between the first build-up layer structure and the second build-up layer structure, and the first build-up layer structure is bonded to the topmost layer of the second circuit layers. The conductive structure penetrates the plurality of the first dielectric layers, the plurality of the first circuit layers, and the adhesive layer, and the conductive structure contacts the topmost layer of the second circuit layers. The conductive structure serially connects the first circuit layers in the direction perpendicular to the substrate. The conductive structure electrically connects the first circuit layers to the topmost layer of the second circuit layers.

In an embodiment of the invention, the circuit carrier board further includes a blind via. The vertical projection of the blind via on the base overlaps with the vertical projections of the first circuit layers and the topmost layer of the second circuit layers on the base. The conductive structure is disposed in the blind via and the conductive structure electrically connects to the first circuit layers.

In an embodiment of the invention, the conductive structure has a top surface, a bottom surface opposite to the top surface, and continuous sidewalls connecting the top surface and the bottom surface, and the conductive structure is taper shaped.

In an embodiment of the invention, the top surface of the conductive structure has a first width, the bottom surface has a second width, and the first width is greater than the second width.

In an embodiment of the invention, each of the first circuit layers includes a plurality of pads and a plurality of conductive vias connecting the pads. The conductive via penetrates the first dielectric layer in the direction perpendicular to the substrate, and the width of the conductive via gradually increases in a direction towards the substrate.

In an embodiment of the invention, the circuit carrier board further includes a soler resist layer partially covering the first build-up layer structure and the conductive structure. The solder resist layer has a plurality of openings respectively partially exposing the first circuit layer and the conductive structure.

In an embodiment of the invention, the manufacturing method of the circuit carrier board further includes forming a portion of the first build-up layer structure and a portion of the conductive structure. The solder resist layer has a plurality of openings respectively exposing one of the portions of the first circuit layer and a portion of the conductive structure.

Based on the above, in the circuit carrier board and the manufacturing method thereof according to an embodiment of the present invention, after the first build-up layer structure is bonded to the substrate, the blind via can be simply formed through the drilling process to penetrate the plurality of the first build-up layer structure. Then, the conductive structure is formed in the blind via to complete the electrical connection between the first circuit layers and the exposed topmost layer of the second circuit layers. In this way, the manufacturing difficulty of the circuit carrier board may be reduced, the production cost may be reduced, and the production yield may be improved. In addition, the circuit carrier board may also have excellent structural strength and reliability, and thus has good quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

Moreover, terms such as "first" and "second" used herein do not represent order, and it should be understood that they are for differentiating devices or operations having the same technical terms.

Secondly, the terms "containing", "including", "having" and the like as used herein are all open terms; i.e., including but not limited to.

Furthermore, the terms "in contact with", "connected to", "bonded to" and the like, as used herein, may mean direct contact or indirect contact via other layers unless otherwise stated.

Figure 1A:
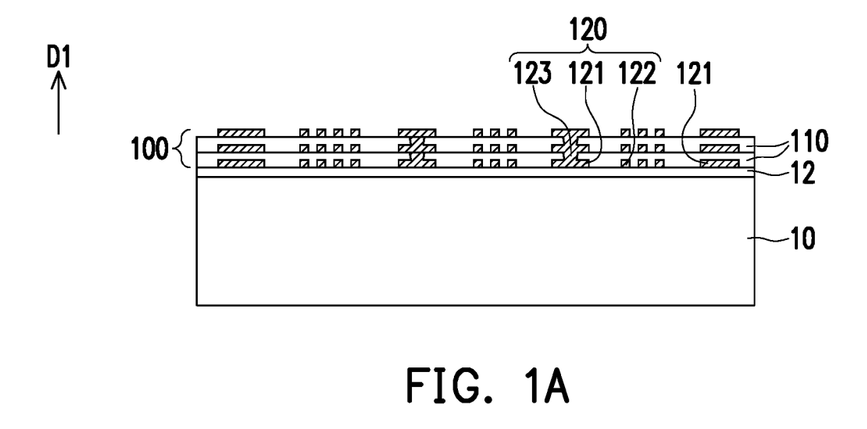
FIG. 1A to FIG. 1F are cross-sectional views showing a manufacturing process of a circuit carrier board of an embodiment of the invention.
Figure 1B:
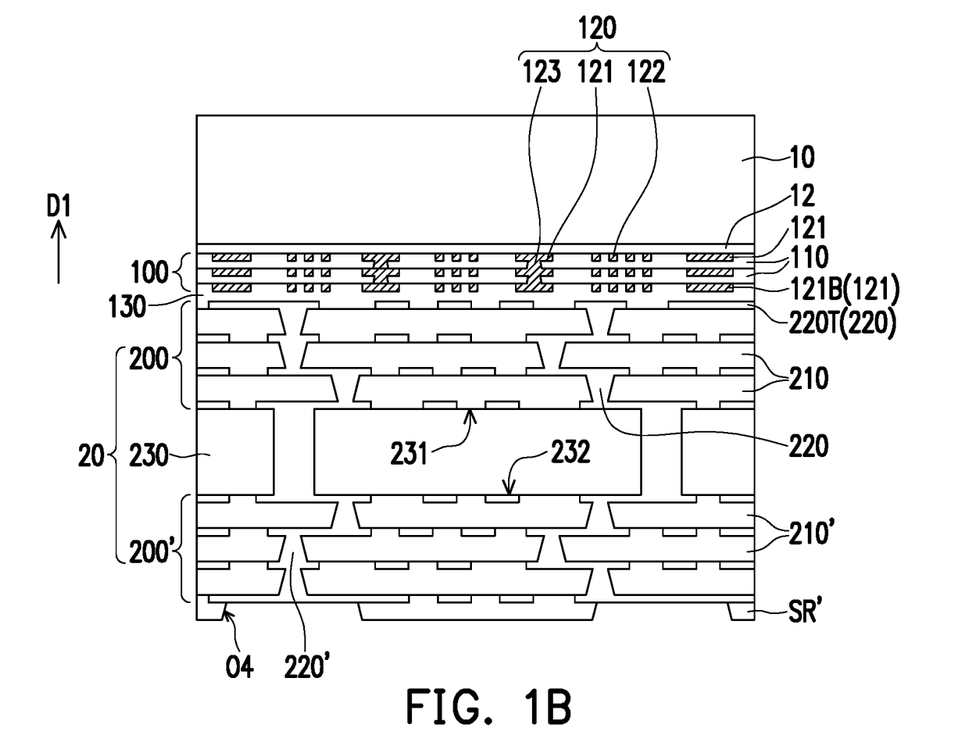
Figure 1C:
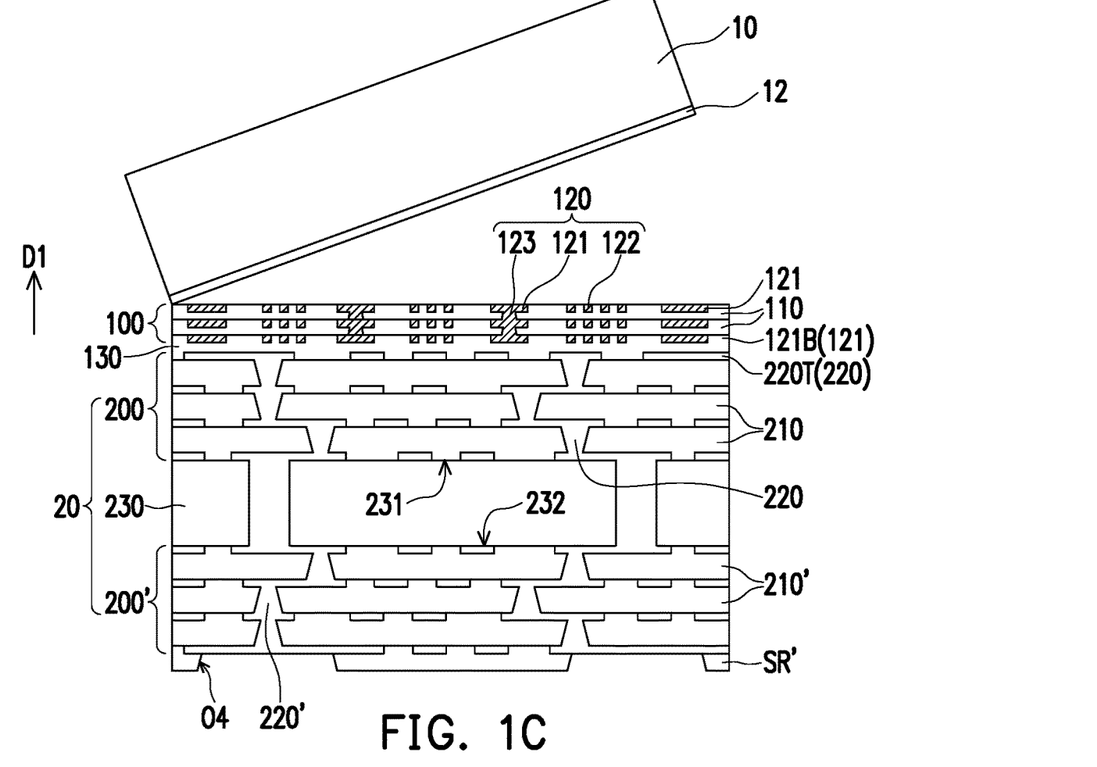
Figure 1D:
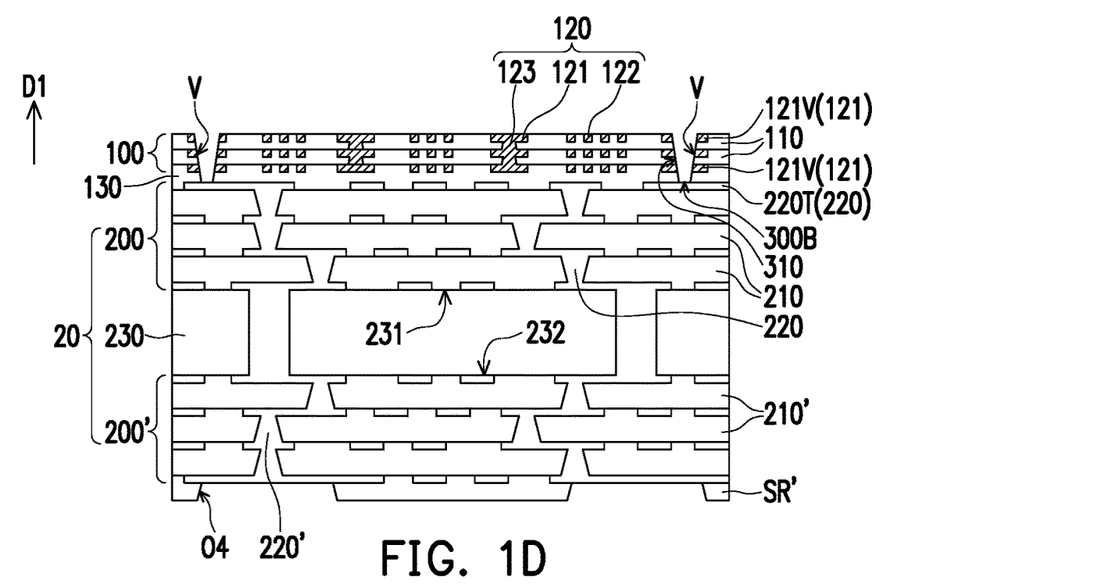
Figure 1E:
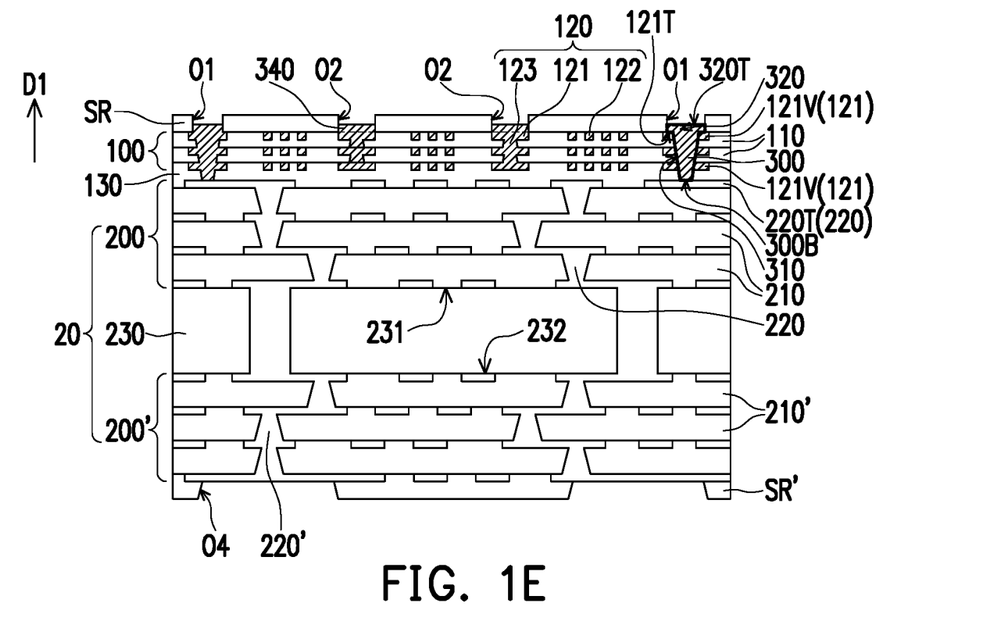
Figure 1F:
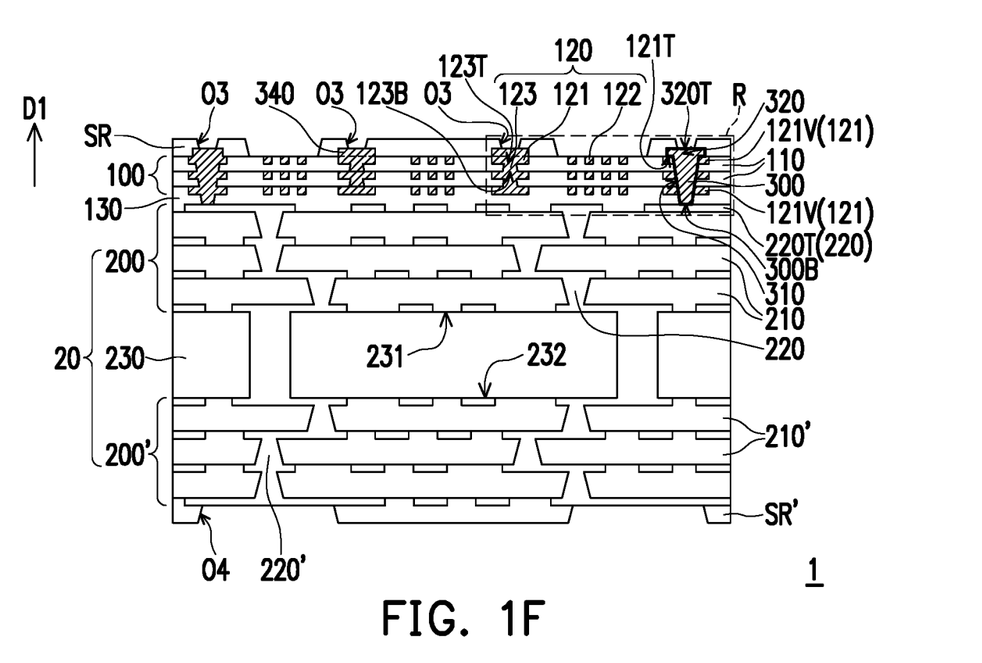

FIG. 1A to FIG. 1F are cross-sectional views showing a manufacturing process of a circuit carrier board of an embodiment of the invention. Referring to FIG. 1F, in the present embodiment, a circuit carrier board 1 includes a first build-up layer structure 100, a substrate 20, an adhesive layer 130 disposed between the substrate 20 and the first build-up layer structure 100, and a conductive structure 300 penetrating through the first build-up layer structure 100. The first build-up layer structure 100 is disposed on the substrate 20, and the first build-up layer structure 100 includes a plurality of first dielectric layers 110 and a plurality of first circuit layers 120. The first dielectric layers 110 and the first circuit layers 120 are alternately stacked. The first circuit layers 120 are disposed in the first dielectric layers 110 and the first circuit layers 120 are electrically connected to each other. The substrate 20 includes a base 230 and a second build-up layer structure 200 disposed on the base 230. The second build-up layer structure 200 includes a plurality of second dielectric layers 210 and a plurality of second circuit layers 220. The second dielectric layers 210 and the second circuit layers are alternately stacked. The second circuit layers 220 are disposed on the second dielectric layers 210 and the second circuit layers 220 are electrically connected to each other. A topmost layer 220T of the second circuit layers 220 is exposed outside of the second dielectric layers 210. The adhesive layer 130 is located between the first build-up layer structure 100 and the second build-up layer structure 200 so as to bond the first build-up layer structure 100 to the substrate 20. Specifically, the first build-up layer structure 100 is bonded to the topmost layer 220T of the second circuit layers 220 of the second build-up layer 200. The conductive structure 300 penetrates the plurality of first dielectric layers 110, the plurality of first circuit layers 120, and the adhesive layer 130. In addition, the conductive structure 300 contacts the topmost layer 220T of the plurality of second circuit layers 220. Additionally, the circuit carrier board 1 further includes a solder resist layer SR partially covering the first build-up layer structure 100 and the conductive structure 300. The following description will briefly explain the manufacturing method of the circuit carrier board 1 according to an embodiment.

Referring to FIG. 1A, the manufacturing method of the circuit carrier board 1 (shown in FIG. 1F) includes the following steps. First, a temporary carrier board 10 is provided. In the embodiment, a release layer 12 may be disposed on the temporary carrier board 10, but the invention is not limited thereto. In the present embodiment, the temporary carrier board 10 may be a glass substrate, a silicon substrate, a ceramic substrate or a combination thereof, and the present invention is not limited thereto. The release layer 12 may be a photo-curable release film or a thermal curable release film, but the invention is not limited thereto. The viscosity of the photo-curable release film is reduced by a photo-curing process; and the viscosity of the thermal curable release film is reduced by thermal-curing process. In other embodiments, the release layer 12 may also be a laser debond release film.

Next, a first build-up layer structure 100 is formed on the release layer 12 on the temporary carrier board 10. In the present embodiment, the first build-up layer structure 100 is, for example, a redistribution layer (RDL) of a multi-layered stack, but the invention is not limited thereto. In detail, the first build-up layer structure 100 may be a single-layered or multi-layered stacked structure, but the invention is not limited thereto. In the present embodiment, the method of forming the first build-up layer structure 100 includes alternatively stacking the plurality of first circuit layers 120 and the plurality of first dielectric layers 110 on the release layer 12 of the temporary carrier board 10. Specifically, a first circuit layer 120 may be formed on the release layer 12 first, and a first dielectric layer 110 may then be formed on the first circuit layer 120 and cover the first circuit layer 120. Then, the first circuit layer 120 and the first dielectric layer 110 are alternately stacked to form a multi-layered stacked first build-up layer structure 100. As shown in FIG. 1A, the first build-up layer structure 100 is exemplified by a stack of three first circuit layers 120 and two first dielectric layers 110, but the invention is not limited thereto. In other embodiments, the number of layers of the first build-up layer structure 100 may be a single layer or multiple layers, which is designed according to the users' needs.

Under the above arrangement, a portion of the first circuit layer 120 may be disposed in the plurality of layers of first dielectric layer 110 and at least one first circuit layer 120 (e.g. in FIG. 1A, the topmost layer of the first circuit layers 120 in a direction D1 perpendicular to the temporary carrier board 10) can be exposed outside of the first dielectric layer 110. The first circuit layers 120 are electrically connected to each other. For example, as shown in FIG. 1A, each of the first circuit layers 120 includes a plurality of pads 121, a plurality of lines 122, and a plurality of conductive vias 123. In some embodiments, the lines 122 may be electrically connected to the pads 121, but the invention is not limited thereto. The conductive vias 123 may be electrically connected to portions of the pads 121 of the different first circuit layers 120 in the direction D1 perpendicular to the temporary carrier board 10. That is to say, the conductive vias 123 may penetrate the first dielectric layer 110 and contact the portion of the pads 121 in the direction D1 perpendicular to the temporary carrier board 10. From another perspective, the conductive vias 123 are, for example, interconnecting vias that are capable of conducting the plurality of layers of the circuit layers.

In the present embodiment, the first circuit layer 120 may be disposed in a process of ultra-fine lines, and the line width of the line 122 is less than or equal to 10 micrometers, but the invention is not limited thereto. In the present embodiment, based on conductivity considerations, the pads 121, the lines 121, and conductive vias 123 of the first circuit layers 120 are generally made of metallic material, for example including copper, aluminum, silver, gold or other suitable materials, but the invention is not limited thereto. According to other embodiments, the first circuit layer 120 may also be made of other conductive materials such as an alloy or a stacked layer of metallic materials and other conductive materials. In the present embodiment, the method of forming the first circuit layer 110 includes electroplating or chemical plating (or known as electroless plating), but the invention is not limited thereto. The material of the first dielectric layer 110 includes a dielectric material. The dielectric material is, for example, a PrePreg, a photoimageable dielectric (PID), a photosensitive polymer (for example, Benzocyclobutene), an Ajinomoto build-up film (ABF), a resin coated cooper foil (RCC), a fiberglass resin composite material or a combination thereof, but the invention is not limited thereto.

Next, referring to FIG. 1B, a substrate 20 is provided. In the present embodiment, the substrate 20 is, for example, a circuit board, and includes a base 230 and a second build-up layer structure 200 disposed on the base 230, but the invention is not limited thereto. In some embodiments, the substrate 20 may also be a coreless substrate, a printed circuit board (PCB), an any-layer printed circuit board, or a substrate applying the technologies of a high-density connection board (HDI), but the invention is not limited thereto.

In detail, the method of forming the substrate 20 includes the following steps. The base 230 is provided first. The base 230 has an upper surface 231 and a lower surface 232 opposite the upper surface 231. In the present embodiment, the base 230 includes a substrate with a core or a coreless substrate. The base 230 may be an insulating substrate, a glass substrate, or a combination thereof, and the invention is not limited thereto. In other embodiments, the material of base 230 may also be a PrePreg or other suitable dielectric materials. In the present embodiment, a plurality of through holes (not labeled) penetrating through the base 230 may be selectively formed in the base 230 to provide a path for conducting the upper surface 231 to the lower surface 232 of the base 230, but the invention is limited thereto. The methods of forming the through holes includes lithography, mechanical drilling, laser drilling or other suitable methods, and the invention is not limited thereto.

Next, the second build-up layer structure 200 is formed on the upper surface 231 of the base 230. In the present embodiment, the second build-up layer structure 200' may also be formed on the lower surface 232 of the base 230. It should be noted that the composition, material and manufacturing method of the second build-up layer structure 200 and the second build-up layer structure 200' are similar. Therefore, only the second build-up layer structure 200 is exemplified and described below, and the details (including structure and manufacturing method) of the second build-up layer structure 200' are not repeated herein. Persons skilled in the arts of the technical fields should be able to infer the structure and manufacturing method of the second build-up layer structure 200' according to the steps of manufacturing process of the second build-up layer structure 200.

In the present embodiment, the method of forming the second build-up layer structure 200 includes alternatively stacking the plurality of second circuit layers 220 and the plurality of second dielectric layers 210 on the upper surface 231 of the base 230. Specifically, a second circuit layer 220 may be formed on the base 230 first, and a second dielectric layer 210 may then be formed on the second circuit layer 220 and covered the second circuit layer 220. Then, the second circuit layer 220 and the second dielectric layer 210 are alternately stacked to form a second build-up layer structure 200 of the multilayer stack. As shown in FIG. 1B, the second build-up layer structure 200 is exemplified by a stack of four second circuit layers 220 and three second dielectric layers 210, but the invention is not limited thereto. In other embodiments, the number of layers of the second build-up layer structure 200 may be a single layer or multiple layers, which is designed according to the users' needs.

Under the above arrangement, a portion of the second circuit layer 220 may be disposed in the plurality of layers of the second dielectric layers 210, and a topmost layer 220T of the second circuit layers 220 (e.g. in FIG. 1B, the topmost layer of the second circuit layers 120 in the direction D1 perpendicular to the base 230) can be exposed outside of the second dielectric layer 210. The second circuit layers 220 are electrically connected to each other. For example, as shown in FIG. 1B, the second circuit layer 220 and the second dielectric layer 210 located at the same horizontal plane may define a single build-up layer. A plurality of the build-up layers may be stacked in a direction D1 perpendicular to the base 230 to form the second build-up layer structure 200. The second circuit layers 220 in the build-up layers of different horizontal planes may extend and penetrate through the second dielectric layer 210 to be electrically connected to each other in the direction D1 perpendicular to the temporary carrier board 10, but the invention is not limited thereto. As such, portions of the plurality layers of the second circuit layers 220 may penetrate through the second dielectric layer 210 to electrically connect the second circuit layers 220 at different horizontal planes to each other, and the other portions of the second circuit layers 220 are only interconnected to the second circuit layers 220 located at the same horizontal plane. In other words, the second circuit layer 220 of the second build-up layer structure 200 may provide the desired horizontal and vertical wiring requirements for the substrate 20.

In the present embodiment, the second circuit layer 220 may be disposed by a process of a normal line requirement or by a process of a high-density line requirement. For example, the linewidth of the second circuit layer 220 may be 5 micrometers to hundreds of micrometers, but the invention is not limited thereto. Based on conductivity considerations, the second circuit layer 220 is generally made of a metal material, for example, including copper, aluminum, silver, gold, or other suitable materials, but the invention is not limited thereto. According to other embodiments, the second circuit layer 220 may also be made of other conductive materials such as alloy or a stacked layer of metallic materials and other conductive materials. In the present embodiment, the method of forming the second circuit layer 220 includes electroplating or chemical plating, but the invention is not limited thereto. The material of the second dielectric layer 210 includes a dielectric material. The dielectric material is, for example, a PrePreg, a photo-imageable dielectric (PID), a photosensitive polymer (for example, Benzocyclobutene), an Ajinomoto build-up film (ABF), a resin coated cooper foil (RCC), a fiberglass resin composite material or a combination thereof, but the invention is not limited thereto.

In the present embodiment, another second build-up layer structure 200' may be disposed on the lower surface 232 of the base 230 with respect to the second build-up layer structure 200. Briefly, the structure of the second build-up layer structure 200' is similar to the second-up layer structure 200. The second build-up layer structure 200' is exemplified by a stack of four second circuit layers 220' and three second dielectric layers 210' alternatively stacked on the lower surface 232 of the base 230. However, the number of layers of the second circuit layers 220' and the second dielectric layers 210' are not limited by which is shown in FIG. 1B. In the present embodiment, the bottommost layer (not labeled, but as shown in FIG. 1B, the bottommost layer of the second circuit layers 220' in the direction D1 perpendicular to the base 230) of the second circuit layers 220' may be exposed outside of the second dielectric layer 210'. Under the above arrangement, the substrate 20 is, for example, a double-sided circuit board, but the invention is not limited thereto.

Next, the adhesive layer 130 is formed on one of the first build-up layer structure 100 or the second build-up layer structure 200. For example, the adhesion layer 130 may be firstly disposed on the first circuit layer 120 covering the first dielectric layer 110. Or the adhesive layer 130 may be firstly disposed on the second dielectric layer 210 to cover the topmost layer 220T of the second circuit layers 220. In the present embodiment, the material of the adhesive layer 130 includes a material selected from the group consisting of a thermosetting polymer or a photopolymer. The thermosetting polymers include, for example: a polyester resin, polyurethanes, a melamine resin, an epoxy resin, polyimides, a silicone, or a vinyl ester. A photopolymer includes, for example, an acrylate or an epoxy resin. However, the invention is not limited thereto. In some embodiments, the material of the adhesive layer 130 may also be similar to that of the first dielectric layer 110 or the second dielectric layer 210, including a PrePreg, a photosensitive dielectric material (such as a PID), a photosensitive polymer, an ABF film, a resin coated cooper foil, a fiberglass resin composite material or a combination thereof, but the invention is not limited thereto.

Next, the first build-up layer structure 100 is bonded to the second build-up layer structure 200. As shown in FIG. 1B, the adhesive layer 130 is located between the first build-up layer structure 100 and the second build-up layer structure 200 to securely bond the first build-up layer structure 100 to the substrate 20. As shown in FIG. 1B, the bottommost pad 121B of the first circuit layer 120 is disposed adjacent to the topmost layer 220T of the second circuit layers 220, but the invention is not limited thereto. Under the above arrangement, the adhesive layer 130 may improve the structural strength and reliability of the first build-up layer structure 100 and the substrate 20.

Next, referring to FIG. 1C, the temporary carrier board 10 and the release layer 12 on the temporary carrier 10 are removed from the first build-up layer structure 100 to expose a portion of the first circuit layer 120. For example, in the direction D1 perpendicular to the base 230, a portion of the topmost pads 121 and a portion of the lines 122 may be exposed outside of the first dielectric layer 110, but the invention is not limited thereto. In the present embodiment, the method of removing the temporary carrier board 10 includes, for example, reducing the viscosity of the release layer 12 by illumination, heating, applying mechanical force (for example, peeling) or by laser dissociation, thereby separating the temporary carrier board 10 from the first build-up layer structure 100.

Then, referring to FIG. 1D, a drilling process is performed to the first build-up layer structure 100. As shown in FIG. 1C and FIG. 1D, the vertical projections of the plurality of electrically separated pads 121 at different horizontal layers on the base 230 overlap with the vertical projection of the topmost layer 220T of the second circuit layers 220 on the base 230. As shown in FIG. 1D, the above described drilling process is performed where the vertical projections of the plurality of pads 121 in the first circuit layer 120 overlapping with the vertical projection of the topmost layer 220T of the second circuit layer 220. Thereby, a blind via V which simultaneously penetrates the first dielectric layers 110, the plurality of pads 121 (for example, the pads 121V that are penetrated) of the first circuit layers 120, and the adhesive layer 130 may be formed. The blind via V described above may expose a portion of the topmost layer 220T of the second circuit layers 220. As shown in FIG. 1D, the present embodiment only schematically shows two blind vias V extending through the first build-up layer structure 100, but the number of the blind vias V is not limited thereto, and is set according the users' needs. In the embodiment, the method for forming the blind via V may include mechanical drilling, laser drilling or other suitable methods, and the invention is not limited thereto. The cross-sectional shape of the blind via V is, for example, a taper, but the invention is not limited thereto.

Next, referring to FIG. 1D and FIG. 1E, the conductive structure 300 is formed in the blind via V. In the present embodiment, the steps of forming the conductive structure 300 includes forming a photoresist pattern PR on the first build-up layer structure 100. The photoresist pattern PR may expose a portion of the pads 121 and the blind via V by a developing process. For example, the photoresist pattern PR may include a plurality of openings O1, O2. The opening O1, for example, overlaps with the blind via V to expose the blind via V and the pad 121V, which is penetrated by the blind via V. The opening O2, for example, overlaps and exposes the pad 121. In the present embodiment, the photoresist pattern PR may be used to define the position of the subsequently formed conductive structure 300. The material of the photoresist pattern PR includes a photosensitive dielectric material, a polyimides, or a polybenzoxazole (PBO), a silicone, an epoxy, a benzocyclobutene (BCB) or other suitable materials, but the invention is not limited thereto.

Next, the photoresist pattern PR is used as a mask, and a conductive material (not shown) is disposed in the blind via V through a plating process to form the conductive structure 300. For example, the conductive structure 300 may be formed on portions of the pads 121V in the opening O1 and in the blind vias V by electroplating or electroless plating. In other words, the conductive structure 300 is filled in the blind via V. In the present embodiment, the conductive structure 300 electrically connects the pads 121V penetrated by the blind vias V in the direction D1 perpendicular to the base 230, and the conductive structure 300 electrically connects the first circuit layer 120 to the second circuit layer 220. From another point of view, the conductive structure 300 serially connects the pads 121V of the first circuit layers 120 in the direction D1 perpendicular to the base 230, so as to electrically connects the first circuit layers 120 to the topmost layer 220T of the second circuit layers 220. Under the above arrangement, the conductive structure 300 and the first circuit layers 120 (for example, the penetrated pads 121V) may form an integrated structure. Thereby, the first build-up layer structure 100 may be electrically connected to the second build-up layer structure 200 on the substrate 20 through simple drilling and plating processes to simplify the process and reduce the cost.

In the present embodiment, a bump 340 may also be formed on the pad 121 in the opening O2. The bump 340 and the conductive structure 300 may be formed through the same plating process, but the invention is not limited thereto. In some embodiments, the bump 340 and the conductive structure 300 may also be formed in different processes, respectively. In the present embodiment, the orthographic projection of the bump 340 on the base 230 is located within the orthographic projection of the opening O2 on the base 230, and the orthographic projection of the bump 340 on the base 230 overlaps with the orthographic projection of the pad 121 on the base 230. In the present embodiment, the conductive material, the conductive structure 300 and the material of the bump 340 include a metal material, for example, including copper, aluminum, silver, gold or other suitable materials, but the invention is not limited thereto. According to other embodiments, the conductive material, the conductive structure 300, and the bumps 340 may also use other conductive materials such as an alloy or a stacked layer of a metal material and other conductive materials. In addition, when the material of the bump 340 and the material of the first circuit layer 120 are the same, the bump 340 and the pads 121 that are in contact with the bump 340 may also be an integrated structure, but the invention is not limited thereto.

Next, referring to FIG. 1E and FIG. 1F, the photoresist pattern PR is removed from the first build-up layer structure 100. A solder resist layer SR is then formed and covering a portion of the first build-up layer structure 100 and a portion of the conductive structure 300. In the present embodiment, the solder resist layer SR has a plurality of openings O3 to partially expose the first circuit layer 120 and the conductive structure 300. For example, the solder resist layer SR may cover a portion of the line 122, a portion of the pads 121, 121V, a portion of the bump 340, and a portion of the conductive structure 300.

As shown in FIG. 1F, the solder resist layer SR' may also be disposed on the second build-up layer structure 200' of the substrate 20, which is on the other side opposite to the first build-up layer structure 100. The solder resist layer SR' also has a plurality of openings O4 to expose a portion of the second circuit layer 220', but the invention is not limited thereto. In the present embodiment, the materials of the solder resist layers SR, SR' include a green lacquer, a photosensitive dielectric material, an ABF, and a polymer resin material, but the invention is not limited thereto. So far, the manufacturing of the circuit carrier board 1 is substantially completed.

Figure 2:
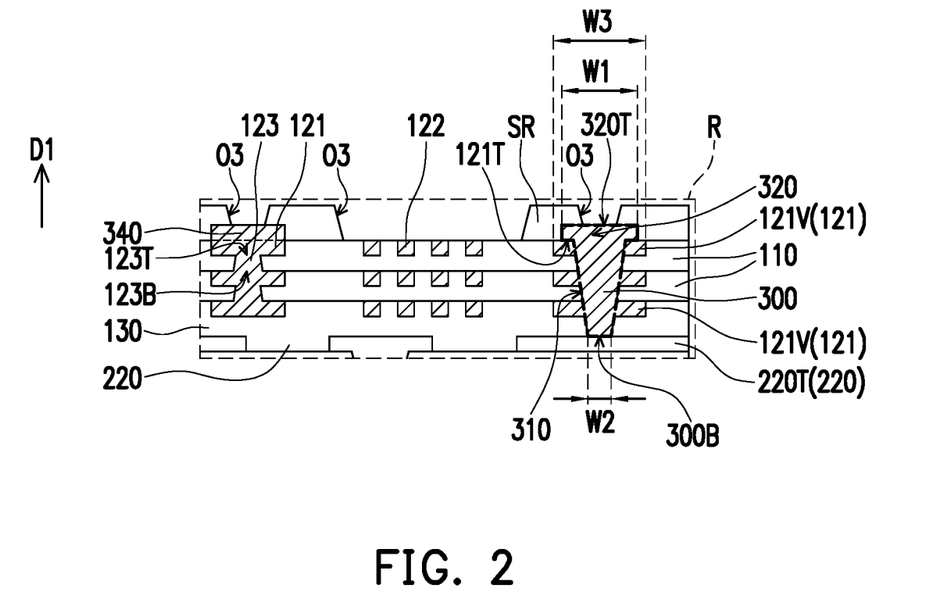
FIG. 2 is an enlarged schematic cross-sectional view of a conductive structure in a region R in FIG. 1F.

FIG. 2 is an enlarged schematic cross-sectional view of a conductive structure in a region R in FIG. 1F. Referring to FIG. 1F and FIG. 2, in the present embodiment, it is worth noting that since the photoresist pattern PR may define the position of the conductive structure 300, thereby the conductive structure 300 may be filled in the blind via V. In addition, the conductive structure 300 can further be disposed on the pad 121V in the opening O1. The portion of the conductive structure 300 disposed on the pad 121V and in the opening O1 may be defined as a top portion 320 of the conductive structure 300. The top portion 320 has a top surface 320T and is not aligned with the top surface 121T of the pad 121V. In other words, the top portion 320 protrudes from the first dielectric layer 110, in addition to be exposed outside of the first dielectric layer 110. In this way, the top portion 320 can be regarded as a pad of the conductive structure 300 for use as a contact of the circuit carrier board 1, and the top portion 320 may be further subjected to a surface treatment process by means of electroless nickel/electroless palladium/immersion gold (ENEPIG), electroless nickel autocatalytic gold (ENAG), or immersion tin (IT), so as to protect the conductive structure 300 in the blind via V. In this way, the reliability and quality of the circuit carrier board 1 may be increased.

In some embodiments, the bump 340 may also be subjected to surface treatment of electroless nickel/electroless palladium/immersion gold, electroless nickel autocatalytic gold, and immersion tin (IT), so as to achieve the protection of the pad 121, and increasing the reliability and quality of the circuit carrier board 1.

In addition, with respect to the top surface 320T of the top portion 320, the conductive structure 300 further includes a bottom surface 300B, and a continuous sidewall 310 connecting the top surface 320T and the bottom surface 300B. Under the above arrangement, the conductive structure 300 and the blind via V may share a conformal shape. Thereby, vertical projections of the conductive structure 300 and the blind via V on the base 230 may overlap vertical projections of the first circuit layer 120 and the topmost layer 220 of the second circuit layers 220T on the base 230. In the present embodiment, the bottom surface 300B may contact the topmost layer 220T of the second wiring layer 220. Under the above arrangement, after the first build-up layer structure 100 is bonded to the substrate 20, the blind via V is simply formed through the drilling process to penetrate the plurality of first circuit layers 120 in the first build-up layer structure 100.

Then, the conductive structure 300 is formed in the blind via V to complete the electrical connection of the first circuit layers 120 to the topmost layer 220T of the exposed second circuit layers 220. Thus, it is possible to reduce the manufacturing difficulty of the circuit carrier board 1, reducing the production cost and improve the production yield. In addition, the circuit carrier board 1 may also have excellent structural strength and reliability, and has good quality.

In addition, as shown in FIG. 2, the top surface 320T has a first width W1 and the bottom surface 300B has a second width W2. In the present embodiment, the first width W1 is greater than the second width W2. Thus the cross-sectional shape of the conductive structure 300 is a taper, but the invention is not limited thereto. In addition, the conductive vias 123, which are located in the first dielectric layer 110 and electrically connecting the lines 122 of different layers, have a top surface 123T and a bottom surface 123B. The top surface 123T and the bottom surface 123B of the conductive vias 123 are respectively connected to the corresponding lines 122. In the present embodiment, the width of the top surface 123T is smaller than the width of the bottom surface 123B. That is, the width of the conductive via 123 is gradually increased towards the base 230 along the direction D1 perpendicular to the base 230. On the other hand, the width of the conductive structure 300 is gradually decreased toward the base 230 along the direction D1 perpendicular to the base 230. As such, the first build-up layer structure 100 may include a tapered conductive structure 300 having a width that gradually decreases towards the bottom of FIG. 2 (ie, towards the base 230), and a tapered conductive via 123 having a width that gradually increases towards the bottom of FIG. 2.

Furthermore, in the present embodiment, the pad 121V also has a third width W3. The third width W3 is greater than the first width W1 and greater than the second width W2. In other words, referring to FIG. 1F and FIG. 2, the orthographic projection of the top portion 320 on the base 230 is located in the orthographic projection of the pad 121V on the base 230, and the portion of the top portion 320 covers the pad 121V, but the present invention is not limited thereto. In some embodiments, the third width W3 may also be greater than or equal to the first width W1, and when the third width W3 is equal to the first width W1, the top portion 320 may completely overlap with the pad 121V.

In some embodiments, a plurality of chips (not shown) may be selectively disposed on the first build-up layer structure 100 and electrically connected to the conductive structures 300 or the bumps 340. In addition, a plurality of solder balls (not shown) or other suitable components may be disposed on the second build-up layer structure 200' and electrically connected to the second circuit layer 220', but the present invention is not limited thereto.

In short, in the circuit carrier board 1 of the present embodiment of the present invention, after the first build-up layer structure 100 is bonded to the substrate 20, the blind via V may be simply formed through the drilling process to penetrate the plurality of first circuit layers 120 in the first build-up layer structure 100. Then, the conductive structure 300 is formed in the blind via V to complete the electrical connection of the first circuit layers 120 to the topmost layer 220T of the exposed second circuit layers 220. In this way, the manufacturing difficulty of the circuit carrier board 1 may be reduced, the production cost may be reduced, and the production yield may be improved. In addition, the circuit carrier board 1 may also have excellent structural strength and reliability, and has good quality. In addition, the conductive structure 300 also has a top portion 320, and the top surface 320T is not aligned with the top surface 121T of the pad 121V. In this way, the top portion 320 may be adapted to be used as contacts of the circuit carrier board 1. Additionally, the surface treatment process may be performed on the top portion 320, so as to protect the conductive structure 300 in the blind via V, thereby improving the reliability and quality of the circuit carrier board 1.

The following embodiments use the same reference numerals and parts in the foregoing embodiments, wherein the same reference numerals are used to refer to the same or similar elements. For the description of the parts omitted from the related art, reference may be made to the foregoing embodiments and is not repeated in the following embodiments.

Figure 3:
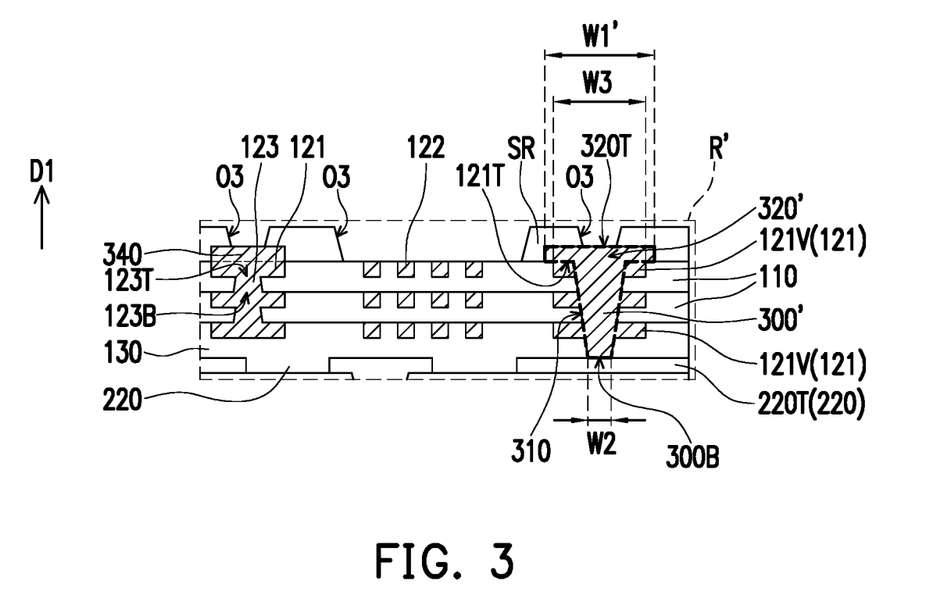
FIG. 3 is an enlarged schematic cross-sectional view of a conductive structure according to another embodiment of the present invention.

FIG. 3 is an enlarged schematic cross-sectional view of a conductive structure according to another embodiment of the present invention. Please refer to FIG. 2 and FIG. 3, the conductive structure 300' of the present embodiment is similar to the conductive structure 300 of FIG. 2. The main difference is that the top surface 320T' of the top portion 320' of the conductive structure 300' of the present embodiment has a first width W1'. The pad 121V has a third width W3. The first width W1' is greater than the third width W3. In other words, the orthographic projection of the pad 121V on the base 230 is located in the orthographic projection of the top portion 320' on the base 230, and the top portion 320' completely covers the pad 121V, but the invention is not limited thereto. Under the above arrangement, the electrical connection between the top portion 320' and the pad 121V can be ensured and the pad 121V can be protected from the environmental water vapor and oxygen, thereby increasing the reliability and performance of the circuit carrier board.

In addition, with the above design, the circuit carrier board of the present embodiment may also achieve the same effects as the above embodiment, and thus will not be described herein.

Figure 4A:
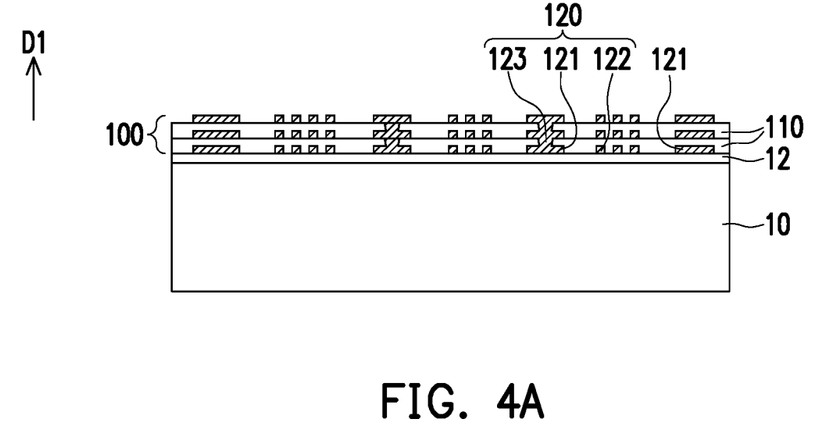
FIG. 4A to FIG. 4G are cross-sectional views showing a manufacturing process of a circuit carrier board of another embodiment of the invention.
Figure 4B:
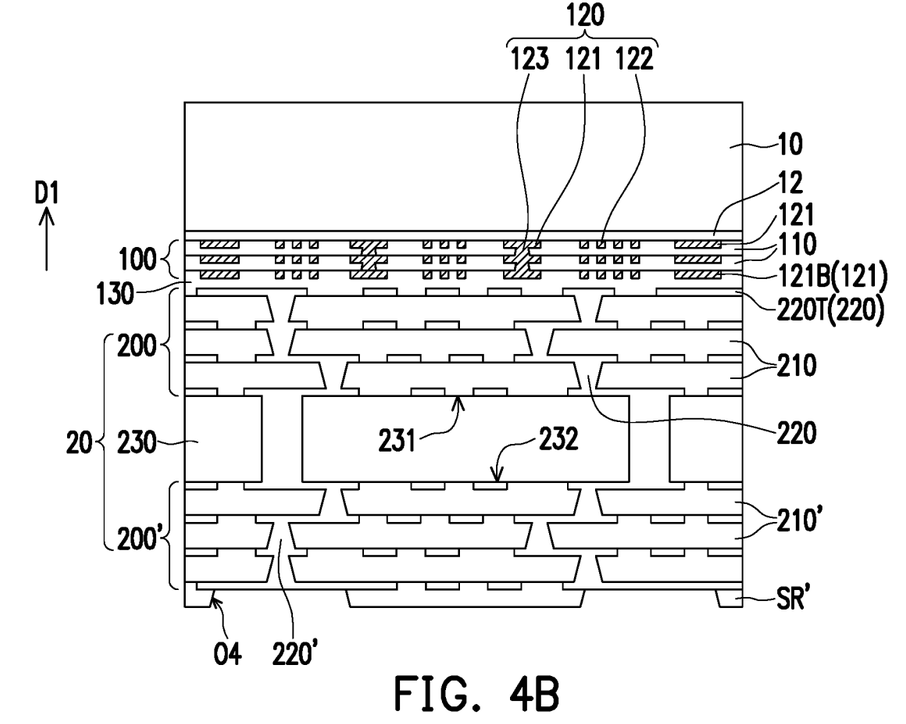
Figure 4C:
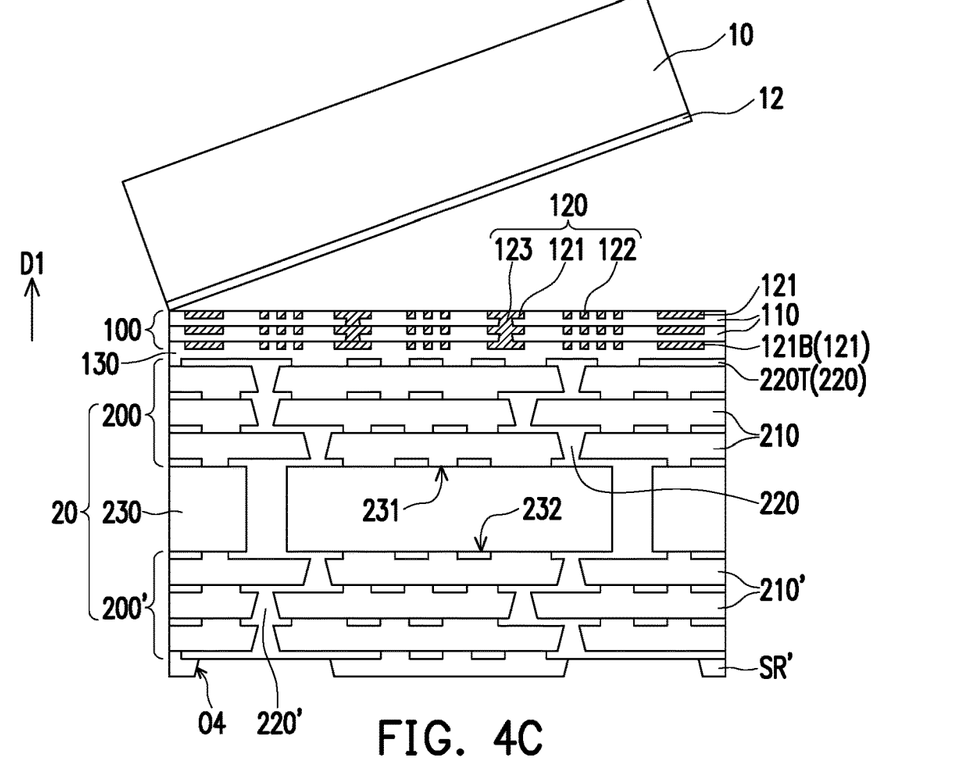
Figure 4D:
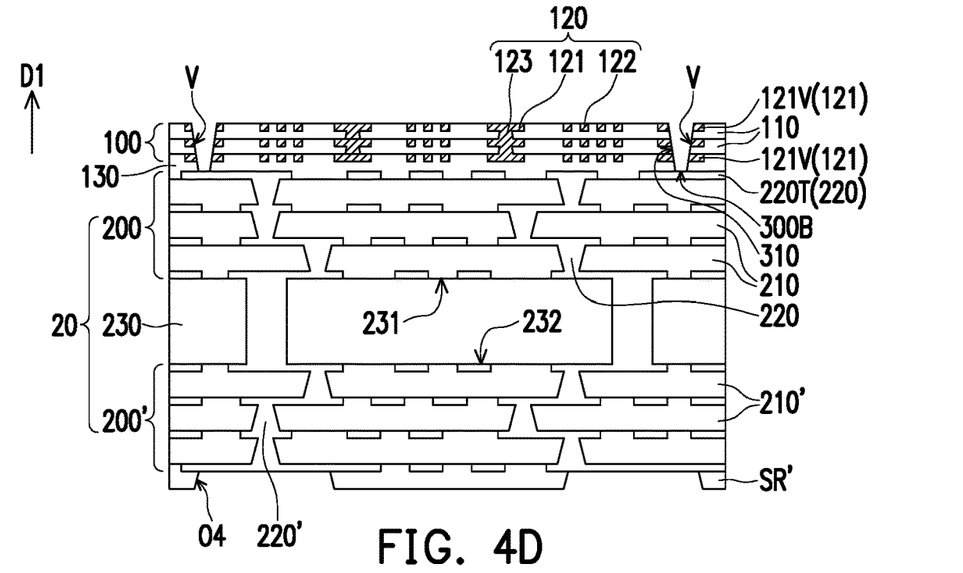
Figure 4E:
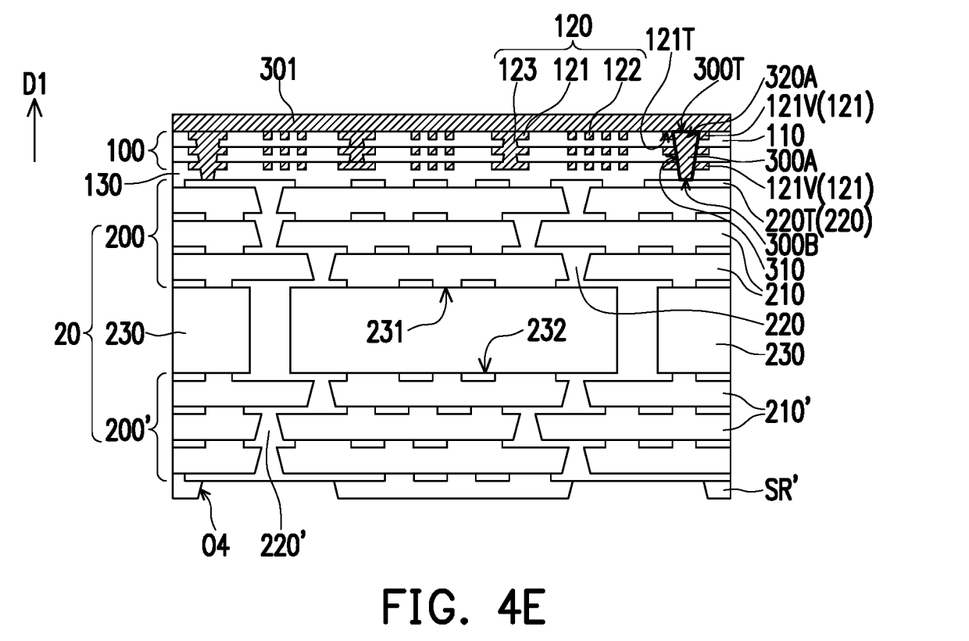
Figure 4F:
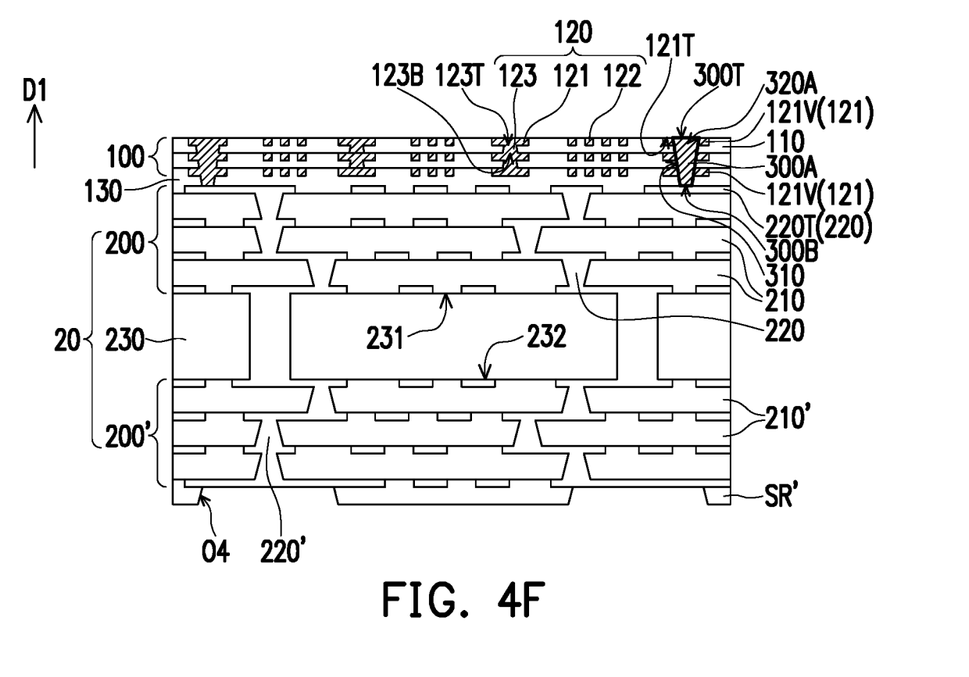
Figure 4G:
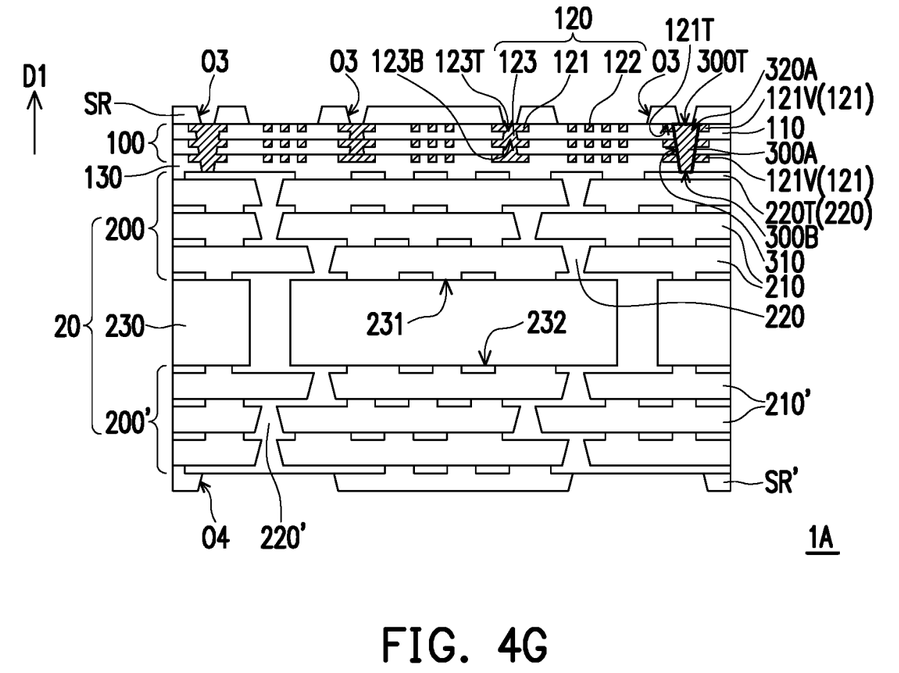

FIG. 4A to FIG. 4G are cross-sectional views showing a manufacturing process of a circuit carrier board of another embodiment of the invention. Referring first to FIG. 1F and FIG. 4G, the circuit carrier board 1A of the present embodiment is similar to the circuit carrier board 1 of FIG. 1F. The main difference is that through performing a chemical mechanical planarization process on the circuit carrier board 1A to complete a deposition of a conductive structure 300A.

Therefore, a top surface 300T of the conductive structure 300A may be aligned with the top surface 121T of the pad 121V (shown in FIG. 4F). A brief description of the manufacturing process of the circuit carrier board 1A will be described in the following. The description of the same or similar components and steps are not repeated.

Referring to FIG. 4A to FIG. 4D, the first build-up layer structure 100 is bonded to the substrate 20, and the temporary carrier board 10 is removed. Next, a drilling process is performed to the first build-up layer structure 100 to form a blind via V. The vertical projection of the blind via V on the base 230 overlaps the vertical projections of the first circuit layer 120 and the topmost layer 220T of second circuit layers 220 on the base 230.

Referring to FIG. 4E, a plating process is then performed on the first build-up layer structure 100 to form the conductive material 301 over the entire surface of the first build-up layer structure 100. The method of forming the conductive material 301 includes electroplating or electroless plating. As shown in FIG. 3E, the conductive material 301 is formed over the first dielectric layer 110 and conductive material 301 is filled in the blind via V. In the present embodiment, the conductive material 301 includes a metallic material, for example including copper, aluminum, silver, gold or other suitable material, but the present invention is not limited thereto. According to other embodiments, the conductive material 301 may also use other conductive materials such as an alloy including an oxide of a metal material, a nitride of a metal material, an oxynitride of a metal material, or stacked layers of a metal material and other conductive materials.

Referring to FIG. 4E and FIG. 4F, a planarization process (not shown) is then performed to remove a portion of the conductive material 301. The planarization process includes a chemical mechanical planarization (CMP), or a brush grinding method, but the invention is not limited thereto. Under the above arrangement, the planarization process can planarize and thin the surface of the first build-up layer structure 100, so as to remove the conductive material 301 on the first dielectric layer 110. The conductive material 301 that is filled in the blind via V may not be removed, and the conductive structure 300A having continuous sidewalls 310 is formed. In some embodiments, the planarization process may also remove portions of the first dielectric layer 110, the first circuit layer 120, and the conductive structure 300A, but the invention is not limited thereto. As such, the first build-up layer structure 100 may have a flat and smooth surface and the entirety of the first build-up layer structure 100 may be both lighter and thinner.

It is worth noting that, since the portion of the top portion 320A of the conductive structure 300A may be removed in the planarization process, the conductive structure 300A is aligned with the first dielectric layer 110. In other words, the top surface 300T of the conductive structure 300A is aligned with the top surface 121T of the pad 121V. Under the above arrangement, the top portion 320A is actually embedded in the first dielectric layer 110, and forms an integrated structure with the topmost layer of the pads 121V. From another perspective, the top portion 320 does not protrude from the first dielectric layer 110. Thus, as compared to the circuit carrier board 1 shown in FIG. 1F, the surface of the first build-up layer structure 100 of the circuit carrier board 1A of the present embodiment may be flatter and smoother, and may further enhance the quality of the circuit carrier board 1A.

In the present embodiment, the conductive structure 300A has a top surface 300T, a bottom surface 300B, and a continuous sidewall 310 connecting the top surface 300T and the bottom surface 300B. The conductive structure 300A may be serially connected to the plurality of pads 121V of the plurality of first circuit layers 120 in a direction D1 perpendicular to the substrate 20. In this way, the conductive structure 300A may be formed through a simple drilling process and a plating process, and the first circuit layer 120 may be electrically connected to the top layer 220T of the second circuit layers 220 through the conductive structure 300A, so as to simplify the manufacturing process and reduce production costs.

Referring to FIG. 4G, a solder resist layer SR is formed to cover a portion of the first build-up layer structure 100 and a portion of the conductive structure 300A. In some embodiments, the solder resist layer SR' may also be disposed on the second build-up layer structure 200'. The solder resist layers SR, SR' respectively have a plurality of openings O3, O4 to expose the conductive structure 300A, a portion of the first circuit layer 120, and a portion of the second circuit layer 220', but the invention is not limited thereto. So far, the manufacturing of the circuit carrier board 1A is substantially completed. With the above design, the circuit carrier board 1A of the present embodiment may also achieve the same effects as the above embodiment, and thus will not be described herein.

Furthermore, an additional surface treatment process such as electroless nickel/electroless palladium/immersion gold, electroless nickel autocatalytic gold, and immersion tin may be performed to the top portion 320A of the conductive structure 300A and/or the pad 121, so as to protect the conductive structure 300A in the blind via V, and increase the reliability and quality of the circuit carrier board 1A.

In addition, a plurality of chips (not shown) may be selectively disposed on the first build-up layer structure 100 and electrically connected to the conductive structure 300A and the pad 121. In addition, a plurality of solder balls (not shown) or other suitable components may be disposed on the second build-up layer structure 200' and electrically connected to the second circuit layer 220', but the invention is not limited thereto.

In summary, in the circuit carrier board and the manufacturing method thereof according to an embodiment of the present invention, after the first build-up layer structure is bonded to the substrate, the blind via can be simply formed through the drilling process to penetrate the plurality of first circuit layers in the first build-up layer. Then, the conductive structure is formed in the blind via to complete the electrical connection between the first circuit layers and the exposed topmost layer of the second circuit layers. In this way, the production difficulty of the circuit carrier board may be reduced, the production cost may be reduced, and the production yield may be improved. In addition, the circuit carrier board may also have excellent structural strength and reliability, and thus has good quality. In addition, the top portion of the conductive structure may be adapted to be used as contact of the circuit carrier board. Additionally, the surface treatment process may be performed on the top portion, so as to protect the conductive structure in the blind via, thereby improving the reliability and quality of the circuit carrier board.

In addition, the circuit carrier board of another embodiment of the present invention may also form a conductive structure in the blind via through the planarization process by removing the conductive material on the first dielectric layer. In this way, the top of the conductive structure may be embedded in the first dielectric layer, so that the first build-up layer structure has a flat and smooth surface and the whole of the first build-up layer structure may be both lighter and thinner, thereby improving the quality of the circuit carrier board.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit carrier board comprising:
   a first build-up layer structure comprising:
      a plurality of first dielectric layers and a plurality of first circuit layers are alternately stacked, the first circuit layers are disposed in the first dielectric layers, and the first circuit layers are electrically connected to each other;
   a substrate comprising:
      a base;
      a second build-up layer structure is disposed on the base, the second build-up layer structure comprising:
         a plurality of second dielectric layers and a plurality of second circuit layers are alternately stacked, the second circuit layers are disposed in the second dielectric layers, and the second circuit layers are electrically connected to each other, wherein the topmost layer of the second circuit layers is exposed outside of the second dielectric layers;
   an adhesive layer is disposed between the first build-up layer structure and the second build-up layer structure, the first build-up layer structure being bonded to the topmost layer of the second circuit layers;
   a conductive structure penetrating the plurality of the first dielectric layers, the plurality of the first circuit layers, and the adhesive layer, and contacting the topmost layer of the second circuit layers,
   wherein the conductive structure serially connects the first circuit layers in a direction perpendicular to the substrate,
   wherein the conductive structure electrically connects the first circuit layers to the topmost layer of the second circuit layers.

2. The circuit carrier board according to claim 1, further comprising a blind via, the vertical projection of the blind via on the base overlapping with the vertical projections of the first circuit layers and the topmost layer of the second circuit layers on the base, wherein the conductive structure is disposed in the blind via and electrically connected to the first circuit layers.

3. The circuit carrier board according to claim 1, wherein the conductive structure has a top surface, a bottom surface opposite to the top surface, and a continuous sidewall connecting the top surface and the bottom surface, and the conductive structure is taper shaped.

4. The circuit carrier board according to claim 3, wherein the top surface of the conductive structure has a first width, the bottom surface has a second width, and the first width is greater than the second width.

5. The circuit carrier board according to claim 1, further comprising a solder resist layer partially covering the first build-up layer structure and the conductive structure, and the solder resist layer has a plurality of openings respectively partially exposing one of the first circuit layers and the conductive structure.

* * * * *